United States Patent [19]

Pan

[11] Patent Number: 5,599,726
[45] Date of Patent: Feb. 4, 1997

[54] METHOD OF MAKING A CONDUCTIVE SPACER LIGHTLY DOPED DRAIN (LDD) FOR HOT CARRIER EFFECT (HCE) CONTROL

[75] Inventor: Yang Pan, Singapore, Singapore

[73] Assignee: Chartered Semiconductor Manufacturing Pte Ltd, Singapore, Singapore

[21] Appl. No.: 567,017

[22] Filed: Dec. 4, 1995

[51] Int. Cl.$^6$ .................................................. H01L 21/336
[52] U.S. Cl. .............................. 437/41; 437/24; 437/29; 437/240; 437/44
[58] Field of Search ........................... 437/24, 240, 29, 437/44, 45, 41 R, 41 RLD, 41 SW

[56] References Cited

U.S. PATENT DOCUMENTS

| | | | |
|---|---|---|---|
| 5,108,935 | 4/1992 | Rodder | 437/24 |
| 5,393,676 | 2/1995 | Anjum et al. | 437/24 |
| 5,521,434 | 5/1996 | Ueno et al. | 257/632 |

Primary Examiner—Mary Wilczewski
Assistant Examiner—Brian K. Dutton
Attorney, Agent, or Firm—George O. Saile; Alek P. Szecsy

[57] ABSTRACT

A Metal Oxide Semiconductor Field Effect Transistor (MOSFET) with limited susceptibility to Hot Carrier Effects (HCEs), and a method by which that MOSFET is formed. There is first provided a semiconductor substrate which has a first portion, a second portion adjoining a side of the first portion and a third portion adjoining an opposite side of the first portion. Formed upon the first portion of the semiconductor substrate is a gate oxide layer which has a gate electrode formed and aligned thereupon. The gate electrode has a first sidewall adjoining the second portion of the semiconductor substrate and a second sidewall adjoining the third portion of the semiconductor substrate. Formed upon the first sidewall of the gate electrode and upon the surface of the second portion of the semiconductor substrate adjoining the first sidewall is a conformal oxide layer. The conformal oxide layer has a dose of fluorine atoms incorporated therein. Formed upon the conformal oxide layer at a location above the second portion of the semiconductor substrate and adjoining the first sidewall of the gate electrode is a conductive spacer. Formed into the second portion of the semiconductor substrate at a location adjoining the conductive spacer and further removed from the gate electrode is a source electrode. Formed into the third portion of the semiconductor substrate is a drain electrode.

11 Claims, 2 Drawing Sheets

METHOD OF MAKING A CONDUCTIVE SPACER LIGHTLY DOPED DRAIN (LDD) FOR HOT CARRIER EFFECT (HCE) CONTROL

BACKGROUND OF THE INVENTION

1. Field of the Invention

The present invention relates generally to Short Channel Effects (SCEs) within Metal Oxide Semiconductor Field Effect Transistors (MOSFETs). More particularly, the present invention relates to methods for control of Hot Carrier Effect (HCE) Short Channel Effects (SCEs) within MOSFETs.

2. Description of the Related Art

As semiconductor technology continues to advance, and the dimensions of integrated circuit device and conductor element features within integrated circuits continues to decrease, several novel effects arise within integrated circuits. In particular, within advanced integrated circuits within which there are formed Metal Oxide Semiconductor Field Effect Transistors (MOSFETs), there arises a general category of novel effects known as Short Channel Effects (SCEs). SCEs typically derive from: (1) the narrowing of gate electrode dimensions within advanced MOSFETs, and/ or (2) the thinning of gate oxide layers which reside beneath those narrow gate electrodes within advanced MOSFETs.

A common and detrimental Short Channel Effect (SCE) within MOSFETs is the Hot Carrier Effect (HCE). The HCE derives from increased electrical fields within advanced MOSFETs, which increased electrical fields result from decreasing gate oxide thickness within those MOSFETs while maintaining constant MOSFET operating voltages. The increased electrical fields accelerate charge carriers from the semiconductor substrate upon which the MOSFET is formed into the gate oxide layer of the MOSFET, where the accelerated charge carriers are captured by free electron states within the gate oxide layer.

Several methods have conventionally been employed in the art to limit Hot Carrier Effects (HCEs) within advanced MOSFETs. Included among these methods are: (1) reductions in MOSFET operating voltages, (2) increases in MOSFET gate oxide hardness to hot carrier injection, such as obtained by incorporating fluorine or nitrogen into the gate oxide, and (3) incorporation of Lightly Doped Drain (LDD) low dose ion implant structures within the semiconductor substrates beneath MOSFET gate electrode edges. Each of these methods will reduce the electric field gradient from the channel region of a MOSFET to the highly doped source/ drain electrodes which adjoin the channel region of the MOSFET. Of these methods, the LDD structure has gained the most wide acceptance, although the LDD structure requires additional masking and ion implantation steps while typically yielding a MOSFET structure which still exhibits residual, although reduced, HCEs.

Non-traditional methods for control of HCEs within MOSFETs have also been disclosed in the art. For example, Rodder, in U.S. Pat. No. 5,108,935 discloses a method for reducing HCEs within MOSFETs by increasing the scattering rate of hot carriers within semiconductor substrates. The increased scattering rate is achieved through incorporating non-conventional dopants into channel regions of MOSFETs.

Although not specifically related to HCEs, methods are also known in the art whereby undesirable movement of other mobile species within MOSFET structures may also be inhibited. For example, methods by which migration of mobile fluorine species within polysilicon gate electrodes of MOSFETs may be inhibited are disclosed by Anjum, et al., in U.S. Pat. No. 5,393,676. Disclosed is a method whereby argon atoms are implanted to form a barrier within a polysilicon gate electrode, beyond which barrier migration of mobile fluorine species is inhibited.

Desirable in the art are additional novel methods whereby SCEs such as the HCE within MOSFETs may be controlled. Particularly desirable are methods which provide for exceedingly high immunity to HCEs within a MOSFET while simultaneously avoiding the masking and ion implantation process steps associated with forming a conventional LDD structure within the MOSFET.

SUMMARY OF THE INVENTION

A first object of the present invention is to provide a Metal Oxide Semiconductor Field Effect Transistor (MOSFET) which exhibits: (1) exceedingly high immunity to Hot Carrier Effects (HCEs), and (2) minimized parasitic capacitances, while simultaneously avoiding the masking and ion implantation process steps associated with forming a conventional Lightly Doped Drain (LDD) structure within the MOSFET.

A second object of the present invention is to provide a MOSFET in accord with the first object of the present invention, which MOSFET is readily manufacturable.

In accord with the objects of the present invention, there is disclosed a new MOSFET and a method by which that new MOSFET may be manufactured. To form the MOSFET of the present invention, there is first provided a semiconductor substrate. The semiconductor substrate has a first portion, a second portion which adjoins a side of the first portion and a third portion which adjoins an opposite side of the first portion. Formed upon the first portion of the semiconductor substrate is a gate oxide layer which has a gate electrode formed and aligned thereupon. The gate electrode has a first sidewall adjoining the second portion of the semiconductor substrate and a second sidewall adjoining the third portion of the semiconductor substrate. Formed upon the first sidewall of the gate electrode and upon the surface of the second portion of the semiconductor substrate adjoining the first sidewall of the gate electrode is a conformal oxide layer. The conformal oxide layer has a dose of fluorine atoms incorporated therein through either an ion implantation method or a Chemical Vapor Deposition (CVD) co-deposition method. Formed upon the conformal oxide layer at the location above the second portion of the semiconductor substrate and adjoining the first sidewall of the gate electrode is a conductive spacer. Formed into the second portion of the semiconductor substrate at a location adjoining the conductive spacer and further removed from the gate electrode is a source electrode. Formed into the third portion of the semiconductor substrate is a drain electrode.

The MOSFET of the present invention exhibits exceedingly high hot carrier immunity due to fluorine hardening of the conformal oxide layer interface at the semiconductor substrate beneath the conductive spacer (ie: at a location above which a conventional Lightly Doped Drain (LDD) structure would normally be formed). In addition, the incorporation of fluorine into the conformal oxide layer at the first sidewall of the gate electrode also minimizes parasitic capacitance which is associated with the conductive spacer.

The MOSFET of the present invention simultaneously avoids the masking and ion implantation process steps associated with forming a conventional LDD structure within the MOSFET. By applying a bias voltage to the conductive spacer of the MOSFET of the present invention, an LDD structure is induced in the second portion of the semiconductor substrate which resides beneath the conductive spacer, while avoiding the masking and ion implantation process steps associated with forming a conventional LDD structure within the MOSFET. The bias voltage is preferably applied simultaneously to the conductive spacer through the gate electrode of the MOSFET. When a bias voltage is not applied to the conductive spacer through the gate electrode of the MOSFET of the present invention, the MOSFET of the present invention will exhibit exceedingly low sub-threshold currents since the induced LDD structure through which reduced sub-threshold current would otherwise pass will cease to exist. The induced LDD structure of the MOSFET of the present invention is formed without masking and ion implantation process steps through which are formed conventional LDD structures.

The MOSFET of the present invention is readily manufacturable. The MOSFET of the present invention is manufactured through forming a conductive spacer upon a fluorinated conformal oxide layer at a sidewall of the gate electrode of a MOSFET whose structure is otherwise conventional to the art of integrated circuit manufacture. Methods and materials through which conformal oxide layers and spacers may in general be formed in manufacturing MOSFETS are known in the art and are readily manufacturable. By analogy, methods through which a conductive spacer may be formed upon a fluorinated conformal oxide layer adjoining a sidewall of the gate electrode of the MOSFET of the present invention are also readily manufacturable.

BRIEF DESCRIPTION OF THE DRAWINGS

The accompanying drawings, which form a material part of this disclosure, show the following.

DESCRIPTION OF THE PREFERRED EMBODIMENTS

Figure 1:
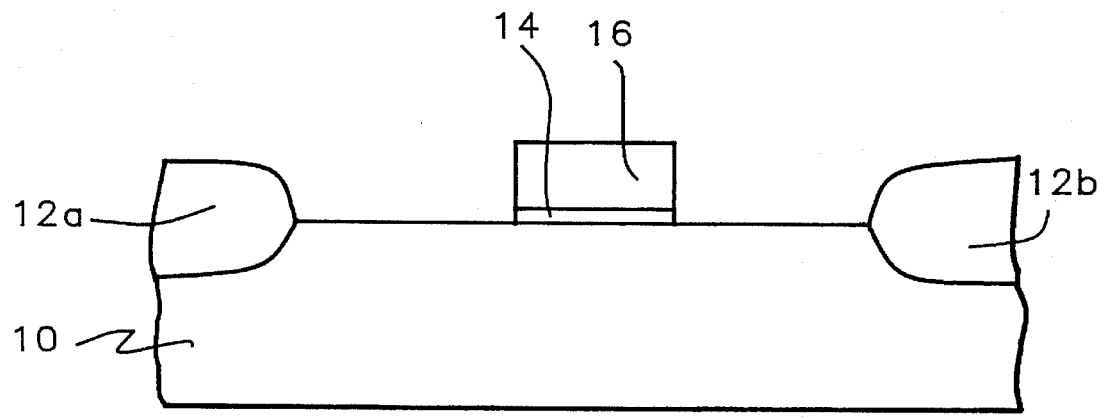
FIG. 1 to FIG. 4 show a series of schematic cross-sectional diagrams illustrating the results of progressive process steps in forming the MOSFET of the preferred embodiment of the present invention into an integrated circuit.

The present invention provides a Metal Oxide Semiconductor Field Effect Transistor (MOSFET) and a method for forming that MOSFET, which MOSFET which exhibits exceedingly high immunity to Hot Carrier Effects (HCEs), while simultaneously reducing the gate to conductive spacer parasitic capacitance of the MOSFET of the present invention. The method by which is formed the MOSFET of the present invention involves forming upon an otherwise conventional MOSFET structure: (1) a fluorinated conformal oxide layer upon a sidewall of the gate electrode and upon the semiconductor substrate surface adjoining that sidewall, and (2) a conductive spacer upon the conformal oxide layer at the juncture of the gate electrode sidewall and the semiconductor substrate. The fluorinated conformal oxide layer and the conductive spacer are formed upon and adjoining the sidewall of the gate electrode adjoining which sidewall is the source electrode of the MOSFET.

Upon applying a bias voltage to the gate electrode of the MOSFET of the present invention, a bias voltage is coupled to the conductive spacer and an LDD structure is induced in the semiconductor substrate which resides beneath that conductive spacer, while avoiding the masking and ion implantation process steps associated with forming a conventional LDD structure within the MOSFET. When a bias voltage is not applied to the gate electrode of the MOSFET of the present invention, the MOSFET of the present invention will exhibit exceedingly low sub-threshold currents since the induced LDD structure through which reduced sub-threshold current would otherwise pass will cease to exist. The induced LDD structure of the MOSFET of the present invention is formed without masking and ion implantation process steps through which are formed conventional LDD structures.

In addition to the conductive polysilicon spacer of the MOSFET of the present invention, the MOSFET of the present invention also incorporates a dose of fluorine atoms into the conformal oxide layer upon and adjoining which is formed the conductive spacer. The fluorinated conformal oxide layer provides a reduced parasitic capacitance within the MOSFET of the present invention, thus leading to higher MOSFET speed. In addition, the fluorinated oxide also provides a higher potential barrier for transfer of charge carriers due to the HCE.

The MOSFET of the present invention may be employed in any integrated circuit wherein there is needed a MOSFET which exhibits exceedingly high hot carrier immunity, exceedingly low parasitic capacitance and/or exceedingly low sub-threshold currents. The MOSFET of the present invention may be incorporated into integrated circuits including but not limited to Dynamic Random Access Memory (DRAM) integrated circuits, Static Random Access Memory (SRAM) integrated circuits, Application Specific Integrated Circuits (ASICs) and integrated circuits having within their fabrications BiPolar Complementary Metal Oxide Semiconductor (BiCMOS) transistors. The MOSFET of the present invention has broad applicability within integrated circuits.

Referring now to FIG. 1 to FIG. 4 there is shown a series of cross-sectional schematic diagrams illustrating progressive stages in forming the MOSFET of the preferred embodiment of the present invention into an integrated circuit. Although the MOSFET of the present invention is provided through forming a conductive spacer upon a fluorinated conformal oxide layer separating a sidewall of the gate electrode of the MOSFET from the source electrode of the MOSFET, MOSFET fabrication methods typically and preferably provide symmetric MOSFET structures where source and drain electrodes are interchangeable. Thus, for the preferred embodiment of the MOSFET of the present invention fluorinated conformal oxide layers and conductive spacers are formed upon both sidewalls of the gate electrode of the MOSFET separating both the source electrode and the drain electrode from the gate electrode of the MOSFET.

Illustrated in FIG. 1 is the MOSFET of the present invention at early stages in its formation. Shown in FIG. 1 is a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate and subsequently patterned to form isolation regions upon the semiconductor substrate. For the preferred embodiment of the present invention, the isolation regions 12a and 12b are preferably formed through a thermal oxidation process whereby portions of the semiconductor substrate 10 exposed through an oxidation mask are consumed to form within and upon the semiconductor substrate 10 isolation regions 12a and 12b of silicon oxide.

Also illustrated within FIG. 1 is a gate oxide layer 14 upon which resides a gate electrode 16. Both the gate oxide layer 14 and the gate electrode 16 reside upon the active semiconductor region of the semiconductor substrate 10. Both the gate oxide layer 14 and the gate electrode 16 are components of a MOSFET.

Methods and materials through which gate oxides and gate electrodes may be formed upon active semiconductor regions of semiconductor substrates are known in the art. Gate oxides may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the present invention, the gate oxide layer 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 40 to about 200 angstroms. For the preferred embodiment of the present invention, the gate electrode 16 is preferably formed by patterning and etching a blanket layer of highly doped polysilicon formed upon the blanket gate oxide layer at a thickness of about 1500 to about 4000 angstroms through a Chemical Vapor Deposition (CVD) process employing silane as the silicon source material along with suitable dopant species. Once the blanket layer of highly doped polysilicon has been patterned to yield the gate electrode 16, the gate electrode 16 may be used as an etch mask to pattern the gate oxide layer 14 from the blanket gate oxide layer.

Figure 2:
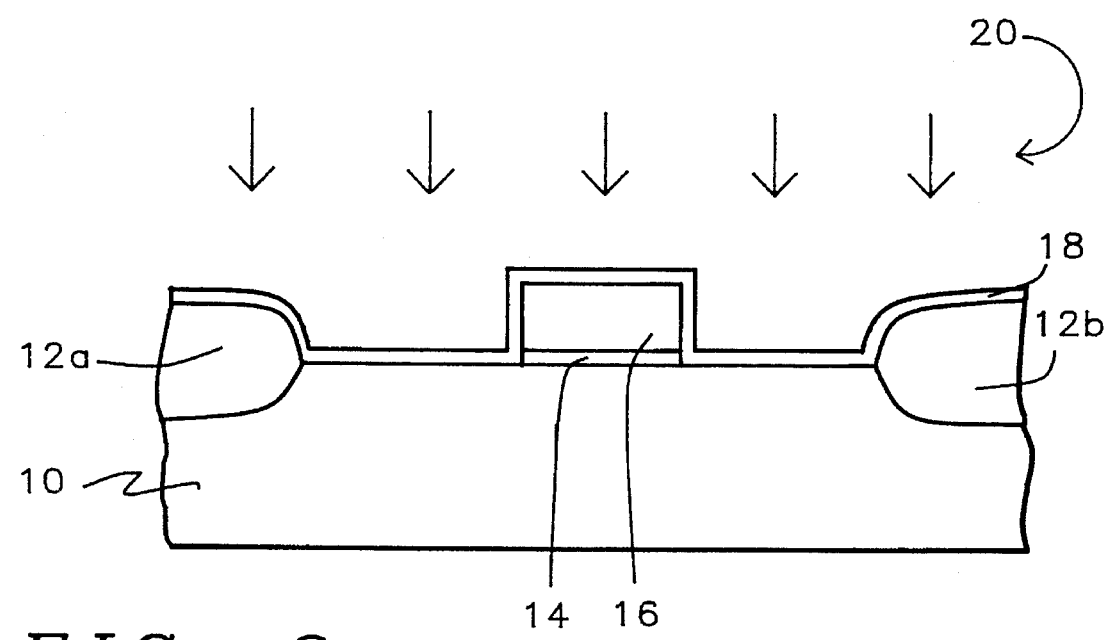

Referring now to FIG. 2, there is shown a cross-sectional schematic diagram illustrating the results of the next series of process steps in forming the MOSFET of the preferred embodiment of the present invention into an integrated circuit. Illustrated in FIG. 2 is the presence of a blanket conformal oxide layer 18 which covers the surface of the integrated circuit illustrated in FIG. 1. Although FIG. 2 illustrates a blanket conformal oxide layer 18, a patterned conformal oxide layer may also be employed in forming the MOSFET of the preferred embodiment of the present invention, provided that the patterned conformal oxide layer covers at least: (1) a pair of opposite sidewalls of the gate electrode 16, and (2) the adjoining portions of the active region of the semiconductor substrate 10. In practice of the present invention, a blanket conformal oxide layer 18 is preferred since it typically provides manufacturing simplicity without compromise in function of the MOSFET of the present invention.

Methods and materials through which conformal oxide layers may be formed upon semiconductor substrates are known in the art. Conformal oxide layers may be formed through methods including but not limited to Chemical Vapor Deposition (CVD) methods, Low Pressure Chemical Vapor Deposition (LPCVD) methods, Plasma Enhanced Chemical Vapor Deposition (PECVD) methods, and Physical Vapor Deposition (PVD) sputtering methods. Conformal oxide layers may be formed from silicon source materials including but not limited to silane and Tetra Ethyl Ortho Silicate (TEOS). Although several of the above methods and materials may be employed in forming the blanket conformal oxide layer 18, the blanket conformal oxide layer 18 is preferably formed through a Low Pressure Chemical Vapor Deposition (LPCVD) method employing Tetra Ethyl Ortho Silicate (TEOS) as the silicon source material, as is common in the art. Preferably, the thickness of the blanket conformal oxide layer 18 is from about 100 to about 500 angstroms.

Also shown in FIG. 2 is the presence of fluorine implanting ions 20 which are implanted into the blanket conformal oxide layer 18. When fluorine implanting ions 20 are implanted into the blanket conformal oxide layer 18, there is formed a blanket conformal oxide layer 18 which: (1) provides reduced parasitic capacitances to the MOSFET of the present invention, thus leading to higher MOSFET speed, and (2) provides a higher potential barrier to capture of hot carriers, thus minimizing the Hot Carrier Effects (HCEs).

Preferably, the fluorine implanting ions 20 are monovalent fluoride ions. The fluorine implanting ions 20 are also preferably implanted at a dose of about 1E14 to about 1E16 fluorine ions per square centimeter and at an ion implantation energy of about 5 to about 50 keV. Under these conditions, a fluorine concentration of about 1E20 to about 1E22 fluorine atoms per cubic centimeter is formed within the blanket conformal oxide layer 18. Alternatively, a fluorine concentration of from about 1E20 to about 1E22 fluorine atoms per cubic centimeter may also be formed within the blanket conformal oxide layer 18 through codepositing a suitable fluorine source material with the silicon source material through which is formed the blanket conformal oxide layer 18.

Figure 3:
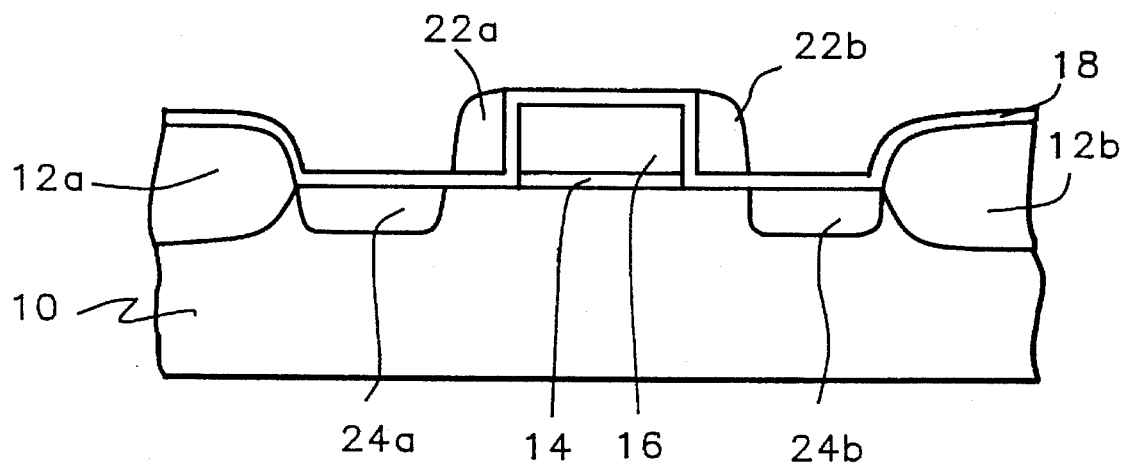

Referring now to FIG. 3 there is shown a cross-sectional schematic diagram illustrating the results of the next series of process steps in forming the MOSFET of the preferred embodiment of the present invention. Shown in FIG. 3 is the presence of conductive spacers 22a and 22b. The conductive spacers 22a and 22b are a unique feature of the MOSFET of the present invention. Although conductive spacers are not typical to the art of MOSFET design and manufacturing, insulator spacers are in general typical to the art of MOSFET design and manufacturing. Thus, the methods through which the conductive spacers 22a and 22b may be formed within the MOSFET of the present invention are analogous to the methods through which are formed insulator spacers within conventional MOSFETS. The materials through which are formed the conductive spacers 22a and 22b of the MOSFET of the present invention will, however, be different from the materials from which are formed insulator spacers in conventional MOSFETS.

Spacers within MOSFET structures may in general be formed through anisotropic etching of blanket layers of materials through which are desired to be formed those spacers. The anisotropic etching of the blanket layer of material is typically undertaken through a Reactive Ion Etch (RIE) etch process employing an etchant gas appropriate to the blanket layer of material which is desired to be formed into a spacer. For the present invention, the conductive spacers 22a and 22b may be formed through anisotropic etching of blanket layers of conductive materials including but not limited to metals, metal alloys and doped polysilicon. The blanket layers of conductive materials may be formed upon the surface of the semiconductor substrate 10 through methods including but not limited to thermal evaporation methods, electron beam assisted evaporation methods and Chemical Vapor Deposition (CVD) methods.

Most preferably, the conductive spacers 22a and 22b are formed through anisotropic etching of a blanket layer of doped polysilicon. The blanket layer of doped polysilicon may be formed upon the surface of the semiconductor substrate 10 through an in-situ doping process whereby suitable dopant atoms are incorporated into the blanket polysilicon layer as it is formed. Alternatively, the blanket layer of doped polysilicon may be formed upon the surface of the semiconductor substrate 10 through doping via ion implantation of a blanket layer of undoped polysilicon formed upon the surface of the semiconductor substrate 10. For either of the preceding methods for forming the blanket layer of doped polysilicon from which is preferably formed the conductive spacers 22a and 22b, a concentration of dopant is incorporated into the blanket layer of doped polysilicon to yield a resistivity of the blanket layer of doped polysilicon, and the conductive spacers 22a and 22b which are formed from the blanket layer of doped polysilicon of from about 10 to about 100 ohms per square. Preferably, the blanket layer of doped polysilicon is anisotropically etched to form the conductive spacers 22a and 22b through a Reactive Ion Etch (RIE) process employing active chlorine species. Preferably, the conductive spacers 22a and 22b, when formed upon the surface of the semiconductor substrate 10, will have a thickness of from about 800 to about 2000 angstroms upon the surface of the blanket conformal oxide layer 18 above the semiconductor substrate 10.

Finally, there is shown in FIG. 3 the presence of source/drain electrodes 24a and 24b formed into the semiconductor substrate 10 at locations defined, respectively, by the isolation region 12a and the conductive spacer 22a, and the isolation region 12b and the conductive spacer 22b. Methods and materials through which are formed source/drain electrodes are conventional to the art of MOSFET design and manufacture. Source/drain electrodes are typically formed through ionizing and implanting into a semiconductor substrate dopant ions of polarity, dose and energy sufficient to form source/drain electrodes within the semiconductor substrate. Boron dopant ions, phosphorus dopant ions and arsenic dopant ions are common in the art of forming source/drain electrodes. For the preferred embodiment of the present invention, the source/drain electrodes 24a and 24b are preferably formed through implanting a dopant ion appropriate to the polarity of the transistor to be formed. The dopant ion is preferably implanted at an ion implant dose of from about 1E15 to about 5E15 ions per square centimeter and an ion implantation energy of from about 5 to about 80 keV.

Figure 4:
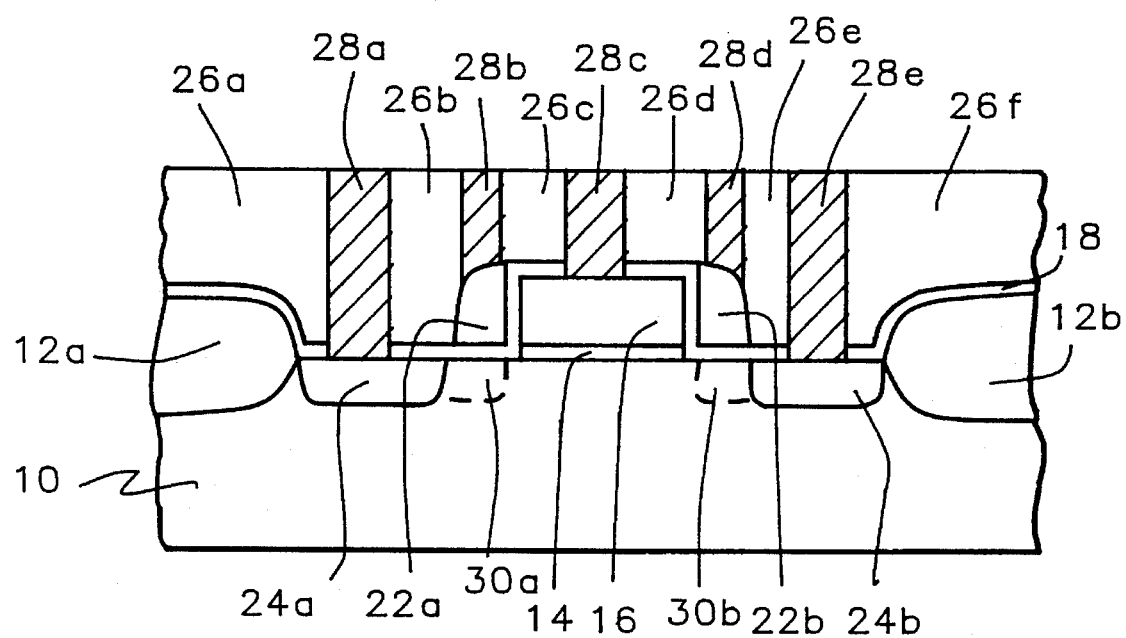

Referring now to FIG. 4 there is shown a schematic cross-sectional diagram illustrating the results of the last series of process steps in forming the MOSFET of the preferred embodiment of the present invention into an integrated circuit. Shown in FIG. 4 is the presence of patterned planarized insulator layers 26a, 26b, 26c, 26d, 26e and 26f which are formed upon the surface of the semiconductor substrate 10 illustrated in FIG. 3. Methods and materials through which may be formed patterned planarized insulator layers are conventional to the art of integrated circuit manufacture. Patterned planarized insulator layers are typically formed through patterning and planarizing through methods as are conventional in the art of conformal insulator layers which are formed upon the surfaces of semiconductor substrates. Patterning is typically, although not exclusively, accomplished through Reactive Ion Etch (RIE) etching methods. Planarizing is typically accomplished through Reactive Ion Etch (RIE) etch-back planarizing methods and Chemical Mechanical Polish (CMP) planarizing methods as are conventional in the art. Materials through which may be formed patterned planarized insulator layers include but are not limited to silicon oxide materials, silicon nitride materials and silicon oxynitride materials.

For the preferred embodiment of the present invention, the patterned planarized insulator layers 26a, 26b, 26c, 26d, 26e and 26f are preferably formed through planarizing and patterning a conformal insulator layer formed of silicon oxide, as is common in the art. The conformal insulator layer of silicon oxide is planarized and subsequently patterned until there is reached the surfaces of the gate electrode 16, the conductive spacers 22a and 22b, and the source/drain electrodes 24a and 24b.

Also shown in FIG. 4 is the presence of conductive contact studs 28a, 28b, 28c, 28d and 28e filling the apertures between the patterned planarized insulator layers 26a, 26b, 26c, 26d, 26e and 26f. Conductive contact studs are conventional to the art of integrated circuit manufacture. Conductive contact studs are typically, although not exclusively, formed through forming into apertures between patterned insulator layers conductive materials from which are formed conductive contact studs. Conductive materials from which are formed conductive contact studs include but are not limited to metals, metal alloys and highly doped polysilicon. Methods through which conductive materials from which may be formed conductive contact studs may be formed into conductive contact studs between patterned insulator layers include but are not limited to thermal evaporation methods, Physical Vapor Deposition (PVD) sputtering methods and Chemical Vapor Deposition (CVD) methods.

For the preferred embodiment of the present invention, the conductive contact studs 28a, 28b, 28c, 28d and 28e are preferably formed at least in part of tungsten metal deposited through a Chemical Vapor Deposition (CVD) method, as is common in the art. The conductive contact studs 28a, 28b, 28c, 28d and 28e are formed to a height sufficient to reach the upper surfaces of the patterned planarized insulator layers 26a, 26b, 26c, 26d, 26e and 26f.

Finally, there is shown in FIG. 4 the presence of induced Lightly Doped Drains (LDDs) 30a and 30b. The induced Lightly Doped Drains (LDDs) 30a and 30b are formed when an electrical potential is applied to the conductive spacers 22a and 22b, respectively, through the conductive contact studs 28b and 28d, respectively. In conjunction with the fluorinated conformal oxide layer 18, the induced Lightly Doped Drains (LDDs) 30a and 30b provide a MOSFET which has exceedingly high hot carrier immunity and low parasitic capacitance, while simultaneously avoiding the masking and ion implantation process steps associated with forming conventional LDD structures.

As is understood by a person skilled in the art, the MOSFET of the preferred embodiment of the present invention and the integrated circuit into which is formed the MOSFET of the preferred embodiment of the present invention are illustrative of the present invention rather than limiting of the present invention. Revisions may be made to methods, materials and structures by which is formed the MOSFET of the preferred embodiment of the present invention and/or integrated circuits into which is formed the MOSFET of the preferred embodiment of the present invention while still forming a MOSFET, or a MOSFET within an integrated circuit, which is within the spirit and scope of the present invention.

What is claimed is:

1. A method for forming a Metal Oxide Semiconductor Field Effect Transistor (MOSFET) comprising:

providing a semiconductor substrate, the semiconductor substrate having a first portion, a second portion adjoining a side of the first portion and a third portion adjoining an opposite side of the first portion;

forming upon the first portion of the semiconductor substrate a gate oxide layer, the gate oxide layer having a gate electrode formed and aligned thereupon, the gate electrode having a first sidewall adjoining the second portion of the semiconductor substrate and a second sidewall adjoining the third portion of the semiconductor substrate;

forming upon the first sidewall of the gate electrode and upon the surface of the second portion of the semiconductor substrate adjoining the first sidewall of the gate electrode a conformal oxide layer, the conformal oxide layer having a dose of fluorine atoms contained therein;

forming upon the conformal oxide layer at the juncture of the first sidewall of the gate electrode and the second portion of the semiconductor substrate a conductive spacer;

forming into the second portion of the semiconductor substrate at a location adjoining the conductive spacer and further removed from the gate electrode a source electrode; and, forming into the third portion of the semiconductor substrate a drain electrode.

2. The method of claim 1 wherein the thickness of the gate oxide layer is from about 40 to about 200 angstroms.

3. The method of claim 1 wherein the thickness of the conformal oxide layer is from about 100 to about 500 angstroms.

4. The method of claim 1 wherein the dose of fluorine atoms within the conformal oxide layer is formed at about 1E20 to about 1E22 fluorine atoms per cubic centimeter.

5. The method of claim 4 wherein the dose of fluorine atoms within the conformal oxide layer is formed through an ion implantation method employing a fluorine source at about 1E14 to about 1E16 ions per square centimeter dose and about 5 to about 50 keV ion implantation energy.

6. The method of claim 4 wherein the dose of fluorine atoms within the conformal oxide layer is formed through co-deposition of a fluorine source material with a silicon source material from which is formed the conformal oxide layer.

7. The method of claim 1 wherein the conductive spacer is from about 800 to about 2000 angstroms in width upon the surface of the second region of the semiconductor substrate.

8. The method of claim 1 wherein the conductive spacer is formed from doped polysilicon.

9. The method of claim 8 wherein the doped polysilicon has a conductivity of from about 10 to about 100 ohms per square.

10. The method of claim 9 wherein the doped polysilicon is doped through implantation of dopant atoms into a blanket polysilicon layer from which is formed the doped polysilicon spacer.

11. The method of claim 9 wherein the doped polysilicon is doped in-situ through incorporation of dopant atoms into a blanket polysilicon layer from which is formed the doped polysilicon spacer.

\* \* \* \* \*